(12) United States Patent  
Hudson

(10) Patent No.: US 8,158,017 B2
(45) Date of Patent: Apr. 17, 2012

(54) DETECTION OF ARCING EVENTS IN WAFER PLASMA PROCESSING THROUGH MONITORING OF TRACE GAS CONCENTRATIONS

(75) Inventor: Eric Hudson, Berkeley, CA (US)

(73) Assignee: Lam Research Corporation, Fremont, CA (US)

(*) Notice: Subject to any disclaimer, the term of this patent is extended or adjusted under 35 U.S.C. 154(b) by 1008 days.

(21) Appl. No.: 12/149,982

(22) Filed: May 12, 2008

(65) Prior Publication Data

US 2009/0280581 A1 Nov. 12, 2009

(51) Int. Cl.
*H01L 21/3065* (2006.01)

(52) U.S. Cl. ............... 216/59; 216/58; 216/63; 216/60; 216/61; 438/7; 438/8; 438/9; 438/16; 438/694

(58) Field of Classification Search .............. 216/59, 216/58, 63, 60–61; 438/694, 706, 5–17; 427/8; 315/111; 219/121.5; 205/791.5
See application file for complete search history.

(56) References Cited

U.S. PATENT DOCUMENTS

| | | | |
|---|---|---|---|
| 5,192,894 A | 3/1993 | Teschner | |
| 5,241,152 A | 8/1993 | Anderson et al. | |
| 5,534,751 A | 7/1996 | Lenz et al. | |
| 5,698,082 A | 12/1997 | Teschner et al. | |
| 5,718,813 A | 2/1998 | Drummond et al. | |
| 5,979,225 A | 11/1999 | Zhou | |
| 5,993,615 A | 11/1999 | Abry et al. | |
| 6,146,492 A | 11/2000 | Cho et al. | |
| 6,192,287 B1 | 2/2001 | Solomon et al. | |
| 6,286,362 B1 | 9/2001 | Coffman et al. | |
| 6,332,961 B1 | 12/2001 | Johnson et al. | |
| 6,346,428 B1 | 2/2002 | Athavale et al. | |
| 6,455,437 B1 | 9/2002 | Davidow et al. | |
| 6,500,389 B1 | 12/2002 | Chou et al. | |
| 6,517,670 B2 | 2/2003 | Okumura et al. | |
| 6,603,538 B1 | 8/2003 | Oluseyi et al. | |
| 6,670,278 B2 | 12/2003 | Li et al. | |
| 6,703,250 B2 | 3/2004 | Chiu | |
| 6,736,944 B2 | 5/2004 | Buda | |
| 6,741,092 B2 | 5/2004 | Eldridge et al. | |
| 6,753,499 B1 | 6/2004 | Yasaka et al. | |
| 6,759,342 B2 | 7/2004 | Yao et al. | |
| 6,772,072 B2 | 8/2004 | Ganguli et al. | |
| 6,787,484 B2 | 9/2004 | Yao et al. | |

(Continued)

OTHER PUBLICATIONS

International Search Report and Written Opinion mailed Dec. 4, 2009 for PCT/US2009/002726.

*Primary Examiner* — Duy Deo
*Assistant Examiner* — Erin Flanagan
(74) *Attorney, Agent, or Firm* — Buchanan Ingersoll & Rooney PC

(57) ABSTRACT

A method of detecting substrate arcing in a semiconductor plasma processing apparatus is provided. A substrate is placed on a substrate support in a reaction chamber of a plasma processing apparatus. Process gas is introduced into the reaction chamber. A plasma is generated from the process gas and the substrate is processed with the plasma. Intensities of real-time spectrometry signals of selected gas species produced in the reaction chamber during plasma processing are monitored. The selected gas species are generated by a substrate arcing event. The arcing event is detected when the intensities are above a threshold value.

13 Claims, 7 Drawing Sheets

U.S. PATENT DOCUMENTS

| | | |
|---|---|---|
| 6,815,362 B1 | 11/2004 | Wong et al. |
| 6,881,276 B2 | 4/2005 | Blonigan et al. |
| 6,894,474 B2 | 5/2005 | Cox et al. |
| 6,927,076 B2 | 8/2005 | Chen et al. |
| 6,977,184 B1 | 12/2005 | Chou et al. |
| 7,006,205 B2 | 2/2006 | Agarwal et al. |
| 7,026,174 B2 | 4/2006 | Fischer |
| 7,064,812 B2 | 6/2006 | Ludviksson et al. |
| 7,086,347 B2 | 8/2006 | Howald et al. |
| 7,092,077 B2 | 8/2006 | Kishkovich et al. |
| 7,169,625 B2 | 1/2007 | Davis et al. |
| 7,199,327 B2 | 4/2007 | Moroz et al. |
| 7,202,169 B2 | 4/2007 | Chen et al. |
| 7,247,252 B2 | 7/2007 | Pan et al. |
| 7,289,866 B2 | 10/2007 | Tomoyasu |
| 7,305,311 B2 | 12/2007 | van Zyl |
| 7,334,477 B1 | 2/2008 | Pirkle |
| 2001/0019903 A1 | 9/2001 | Shufflebotham et al. |
| 2002/0005159 A1* | 1/2002 | Kitagawa et al. ............... 117/13 |
| 2002/0102856 A1* | 8/2002 | Xia et al. ...................... 438/710 |
| 2003/0205327 A1* | 11/2003 | Howald et al. ........... 156/345.28 |
| 2004/0031699 A1* | 2/2004 | Shoji ......................... 205/791.5 |
| 2004/0115943 A1 | 6/2004 | Yao et al. |
| 2005/0067386 A1 | 3/2005 | Mitrovic |
| 2006/0000799 A1* | 1/2006 | Doh et al. ....................... 216/59 |
| 2006/0027249 A1* | 2/2006 | Johnson et al. ................ 134/1.1 |

* cited by examiner

DETECTION OF ARCING EVENTS IN WAFER PLASMA PROCESSING THROUGH MONITORING OF TRACE GAS CONCENTRATIONS

BACKGROUND

Plasma processing apparatuses are used to process substrates by techniques including etching, physical vapor deposition (PVD), chemical vapor deposition (CVD), ion implantation and resist removal. One type of plasma processing apparatus used in plasma processing includes a reaction chamber containing upper and bottom electrodes. An RF generated plasma between the electrodes produces energetic ions and neutral species that etch the wafer substrate and chamber parts within the reaction chamber.

SUMMARY

In one embodiment, a method of detecting substrate arcing in a semiconductor plasma processing apparatus is provided. A substrate is placed on a substrate support in a reaction chamber of a plasma processing apparatus. Process gas is introduced into the reaction chamber. A plasma is generated from the process gas and the substrate is processed with the plasma. Intensities of real-time spectrometry signals of selected gas species produced in the reaction chamber during plasma processing are monitored. The selected gas species are generated by a substrate arcing event. The arcing event is detected when the intensities are above a threshold value.

In another embodiment, a plasma processing apparatus includes a substrate holder which supports a substrate within an interior of a reaction chamber. A gas supply supplies process gas to the interior of the reaction chamber using a gas distribution member. A power source supplies energy into the interior of the reaction chamber and energizes the process gas into a plasma state for processing the substrate. A gas sensor is adapted to monitor gas species in the reaction chamber during plasma processing to identify gas species produced by substrate arcing. An alarm generates a warning signal when gas species produced by substrate arcing are identified.

DETAILED DESCRIPTION

Figure 1A:
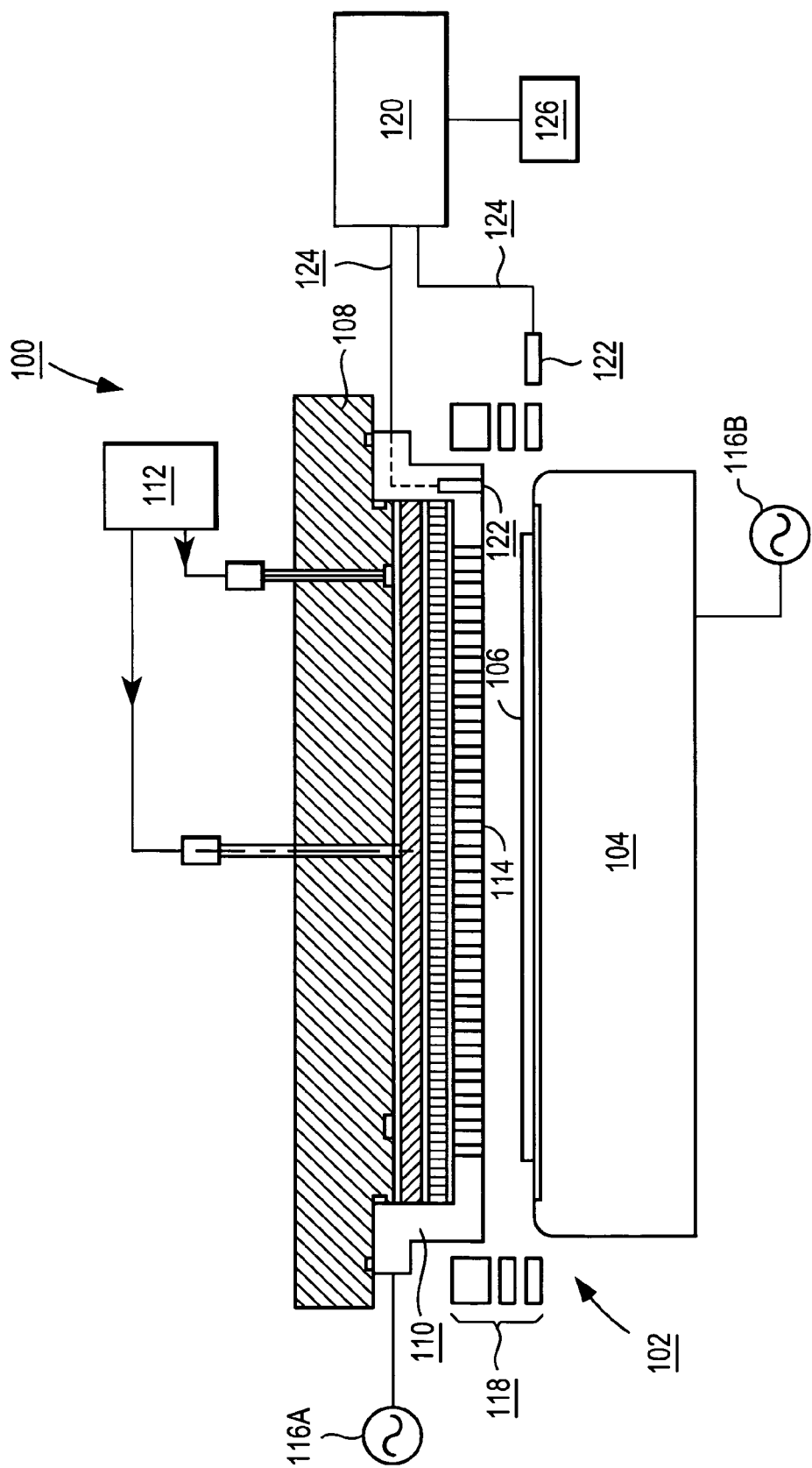
FIG. 1A is a cross-sectional view of an exemplary embodiment of a plasma apparatus.

Semiconductor materials can be manufactured into specific electronic devices, such as transistors, diodes, capacitors and the like, by the selective build up and removal of layers of materials. In the fabrication of integrated circuits, the continuing increase in the number of devices on a chip and the accompanying decrease in the minimum feature sizes have placed increasingly difficult demands upon many of the fabrication steps used in integrated circuit fabrication including depositing layers of different materials onto sometimes difficult topologies and the removal of material and formation of features within those layers.

Plasma-enhanced chemical vapor deposition (PECVD) can be used to form various thin films in a semiconductor integrated circuit. For example, PECVD can form thin films such as $SiO_2$, $Si_3N_4$, Si or the like with high purity and high quality. In the reaction process of forming a thin film, raw material can be supplied to a reaction chamber in the form of gaseous constituents so that gaseous molecules are thermally dissociated and combined in the gas and on a surface of the substrates so as to form a thin film.

Etching is one technique for removing layers of semiconductor or other materials from a given substrate and producing features on integrated circuits. For example, openings (e.g., trenches or vias) can be formed in a substrate layer by depositing an overlying mask layer, such as an organic photoresist. The mask layer can be patterned into the shape of a trench, contact or via, followed by etching.

Plasma etching is of particular interest in producing electronic devices due to better resolution and improved dimensional and shape control capabilities in comparison to various methods of wet etching. Accordingly, plasma etching is favorably utilized where superior pattern control and delineation are required, such as the processing of semiconductor wafers to form large scale integrated devices and integrated circuits.

A plasma reactor may be employed to perform various processes on a semiconductor wafer in microelectronic fabrication including dry etching or deposition. A wafer is placed inside a vacuum chamber of the reactor and process gases, including etchant or deposition gases, are introduced into the chamber. The gases are energized to ignite and maintain a plasma. Depending upon the composition of the gases from which the plasma is formed, the plasma may be employed to etch a particular material from the wafer or may be employed to deposit a thin film layer of material onto the wafer. The processing chambers are configured to receive processing gases (i.e., etch chemistries) while a radio frequency (RF) power is applied to one or more electrodes of the processing chamber. The pressure inside the processing chamber is also controlled for the particular process. Upon applying the desired RF power to the electrode(s), the process gases in the chamber are activated such that a plasma is created. The plasma is thus generated to perform the desired etching of the selected layers of the semiconductor wafer.

As integrated circuit devices continue to shrink in both their physical size and their operating voltages, their associated manufacturing yields become more susceptible to any defects affecting critical features. Defects on the wafer surface can locally disrupt pattern transfer during photolithography and etching steps.

One such source of defects is related to arcing events which can occur during plasma processing of the wafer. In general, arcing refers to transient high density plasma filaments that carry electrical current between two surfaces in the reactor and/or the wafer. Substrate arcing refers to arcing that occurs either between the reactor and the wafer; or between two locations within the wafer. Substrate arcing can potentially cause material degradation of the wafer, including undesirable sputtering of material, depositing of material or high temperature volatilization of some materials. Although arcs typically have small diameters and short duration, the power density of the arc can cause significant damage, even if the total power dissipation is small. For example, substrate arcing events can produce fine craters (i.e., on the orders of microns) which can damage critical features, including gate structures, intermetal dielectric layers (inorganic or organic) or metallic interconnect lines, resulting in the malfunction or failure of the integrated circuit component. Thus, a need exists for a reliable method of detecting substrate arcing in real-time to ensure the plasma processing apparatuses experiencing substrate arcing are taken off-line for maintenance before multiple wafers are damaged.

A method of detecting substrate arcing is provided, through the real-time monitoring of gas species and identification of gas species produced by substrate arcing in the plasma processing apparatus. Substrate arcing events within a wafer or between a wafer surface and a plasma chamber surface releases volatile species into the plasma. For example, a substrate arcing event can cause rapid heating of the substrate and release volatile decomposition products associated with silicon, aluminum, copper (i.e., aluminum-, copper-, or silicon-bearing species) or organic materials (i.e., photoresist or organic dielectrics), resulting in a sudden increase or spike in the concentration of decomposition products near the wafer surface. Products related to the decomposition of photoresist, for example, can produce more stable molecules, which are capable of diffusing to a sensor capable of measuring gas concentrations, located near the wafer surface. On the other hand, decomposition products related to the silicon, aluminum or copper may condense on the surface of the wafer prior to detection.

Although substrate arcing events can produce gaseous species (e.g., from decomposition of organic materials) some gaseous species may be undetectable due to the high background concentration of process gases (i.e., etching gases or CVD gases). Examples of process gases used for etching include hydrocarbon gases (e.g., $C_xH_y$), fluorocarbon gases (e.g., $C_xF_y$), hydrofluorocarbon gases (e.g., $C_xH_yF_z$), halogen-containing gases (e.g., $NF_3$, HBr, $Cl_2$), oxygen-containing gases (e.g., $O_2$), nitrogen-containing gases (e.g., $N_2$, $NH_3$) or inert gases (e.g., He, Ar). Examples of process gases used for thin-film deposition include silicon-containing reactant gas selected from the group consisting of $SiH_4$, $SiF_4$, $Si_2H_6$, tetraethylorthosilicate (TEOS), tetramethylcyclotetrasiloxane (TMCTS) and mixtures thereof. The process gases for thin-film deposition may include $H_2$, $O_2$, $N_2$, $NH_3$, $NF_3$, $N_2O$, and NO, and mixtures thereof.

Figure 1B:
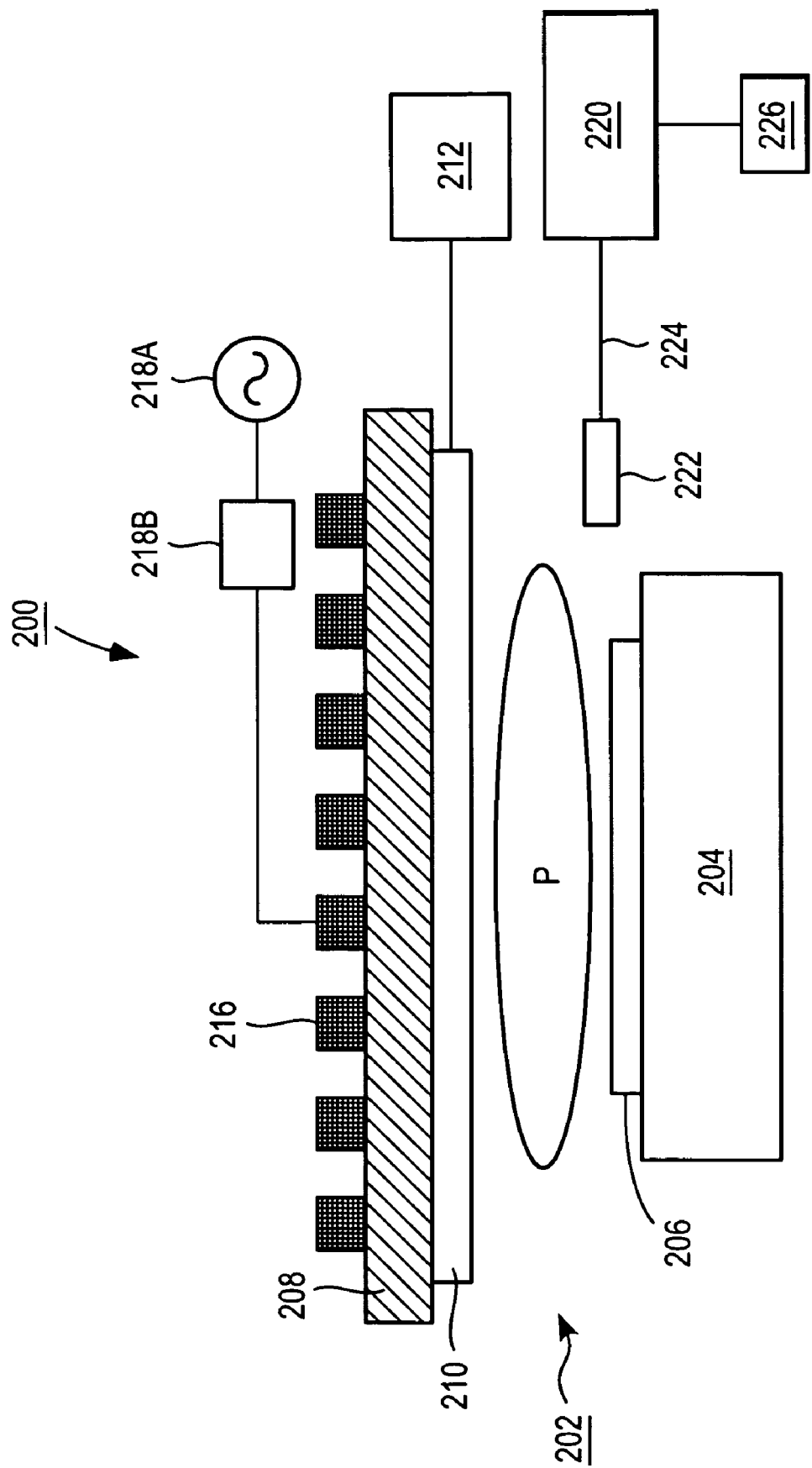
FIG. 1B is a cross-sectional view of an inductively coupled plasma processing apparatus.

FIG. 1 illustrates an exemplary semiconductor material plasma processing apparatus 100 for etching. Plasma processing apparatus 100 comprises a reaction chamber 102 containing a substrate support 104 on which a substrate 106 is supported during plasma processing. The substrate support 104 for supporting a substrate 106 in the interior of the reaction chamber 102 can include a clamping device, preferably an electrostatic chuck, which is operable to clamp the substrate 106 on the substrate support 104 during processing.

The exemplary plasma process chamber 100 shown in FIG. 1 includes a showerhead electrode assembly having a top plate 108 forming a wall of the reaction chamber 102 and a showerhead electrode 110 attached to the top plate 108. Gas supply 112 supplies process gas to the interior of the reaction chamber 102, via showerhead electrode 110. Showerhead electrode 110 includes multiple gas passages 114 extending through the thickness of the showerhead electrode 110 for injecting process gas into a space in a plasma reaction chamber 102 located between showerhead electrode 110 and the substrate support 104.

The process gas flows through showerhead electrode 110 and into the interior of the reaction chamber 102. Next, the process gas is energized into the plasma state in the plasma process chamber 100 by a power source 116A, such as an RF source driving showerhead electrode 110, and/or a power source 116B at one or more frequencies from about 0.3 to about 600 MHz (e.g., 2 MHz, 13.56 MHz, 60 MHz) driving an electrode in the substrate support 104 at one or more frequencies from about 0.3 to about 600 MHz (e.g., 2 MHz, 13.56 MHz, 60 MHz). The RF power applied to the showerhead electrode 110 can be changed to perform different process steps such as when different gas compositions are supplied into the plasma process apparatus 100. In another embodiment, showerhead electrode 110 can be grounded.

In one embodiment, the plasma can be generated in the interior of plasma process chamber 100 by supplying RF energy from two RF sources to the showerhead electrode 110 and/or the substrate support 104, or the showerhead electrode 110 can be electrically grounded and RF energy at a single frequency or multiple frequencies can be supplied to the substrate support 104. Additionally, a plasma confinement ring assembly 118 can be provided outwardly of showerhead electrode 110 and substrate support 104 to confine the plasma in the space located between the showerhead electrode 110 and substrate support 104. A detailed discussion of plasma confinement rings and secondary grounds used in RF capacitively coupled plasma reactors can be found in commonly assigned U.S. Pat. No. 5,534,751, which is hereby incorporated by reference.

Once a substrate arcing event occurs and upon the release of gaseous species associated with decomposition products, it would be preferable to detect these decomposition products before such gases become diluted in dynamic flow of the processing gases and the concentration of the decomposition products in the etching gases falls below the detection limit of the gas detector.

Gaseous species associated with substrate arcing can be detected by collecting volatile decomposition products for analysis by gas sensor 120 with a sampling structure 122 and transported to gas sensor along gas line 124. To prevent condensation of such gaseous species, gas line 124 can be heated. For greater sensitivity of the gaseous species associated with substrate arcing, sampling structure 122 can be placed in the vicinity of the substrate 106 placed on substrate support 104.

In one embodiment, sampling structure 122 can be a tube placed outwardly of the plasma confinement rings 118. Exemplary sampling tube materials can include quartz, silicon, silicon nitride or silicon carbide or other plasma resistant ceramic materials such as yttria. In another embodiment, sampling structure 122 can be a channel embedded directly in showerhead electrode 110. Once substrate arcing has been detected, a signal from alarm 126 is generated. For example, the alarm 126 can be an audio warning, visual warning, an electronic record or instructing an operator to take corrective action to minimize substrate arcing or to terminate plasma processing.

In another embodiment, as illustrated in FIG. 2, inductively coupled plasma (ICP) processing apparatus 200 can be used for depositing (e.g., plasma enhanced chemical vapor deposition or PECVD) and plasma etching of materials on substrates by supplying process gas into a vacuum chamber at a low pressure (i.e., below 50 mTorr) and the application of radio-frequency (RF) energy to the gas. FIG. 2 is a cross-sectional view of an embodiment of an ICP plasma processing apparatus 200. An example of an ICP plasma processing chamber is the TCP® etch or deposition system, manufactured by Lam Research Corporation, Fremont, Calif. The ICP plasma processing apparatus is also described, for example, in commonly-owned U.S. Pat. No. 4,948,458, which is incorporated by reference in its entirety. Reaction chamber 202 includes a substrate support 204 for supporting the substrate 206 in the interior of the reaction chamber 202. Dielectric window 208 forms a top wall of reaction chamber 202. Process gases are injected to the interior of the reaction chamber 202 through a gas distribution member 210. Examples of gas distribution member 210 include a showerhead, gas injector or other suitable arrangement. A gas supply 212 supplies process gases to the interior of reaction chamber 202 through gas distribution member 210.

Once process gases are introduced into the interior of reaction chamber 202, they are energized into a plasma state by an energy source 216 supplying energy into the interior of reaction chamber 202. Preferably, the energy source 216 is an external planar antenna powered by an RF source 218A and RF impedance matching circuitry 218B to inductively couple RF energy into reaction chamber 202. An electromagnetic field generated by the application of RF power to planar antenna energizes the process gas to form a high-density plasma P (e.g., $10^{11}$-$10^{12}$ ions/cm$^3$) above substrate 206.

A dielectric window 208 underlies planar antenna and gas distribution member 210 is placed below dielectric window 208. A high-density plasma is generated in the zone between gas distribution member 210 and substrate 206, for either deposition or etching of substrate 206.

Similar to the FIG. 1 embodiment, gaseous species associated with substrate arcing can be detected by collecting such gaseous species for analysis with gas sensor 220 with a sampling structure 222 and transported to gas sensor along gas line 224. To prevent condensation of the decomposition products, gas line 224 can be heated. For greater sensitivity of decomposition products, sampling structure 222 is placed in the vicinity of substrate 206 placed on substrate support 204. Once substrate arcing has been detected, a warning signal from alarm 226 is generated. For example, the alarm 226 can be an audio warning, visual warning, an electronic record or instructing an operator to take corrective action to minimize substrate arcing or to terminate plasma processing.

In a preferred embodiment, the gas sensor 120/220 can be a mass spectrometer, preferably, a residual gas analyzer (RGA) mass spectrometer. RGA mass spectrometers are suitable for measuring trace gas concentrations in vacuum systems and operate by analyzing the sample gas. The sample gas is ionized and the ions are separated based on mass-to-charge ratio by a quadrupolar electric field using a combination of direct current (DC) and radio-frequency (RF) potentials. The instrument measures the flux of ions versus mass-to-charge ratio, and thereby provides a detailed chemical analysis of the sample gas. The RGA can be equipped with an electron multiplier for additional sensitivity or higher scanning speeds (e.g., 20 Hz or more at a single mass). In the preferred embodiment, the RGA can be used to detect the decomposition by-products of photoresist, which is detectable over the background processing gases. For example, a real-time signal from a mass spectrometer can be generated during plasma processing. The real-time signal from the mass spectrometer can include either a full spectrum of atomic masses (e.g., up to 200 AMU) or collection at a single mass.

As described above, not all gaseous species relating to a substrate arcing event are readily detectable, due to the high background concentration of process gases. For example, the gaseous species relating to a substrate arcing event and the process gas may generate overlapping peaks (i.e., two peaks at the same AMU) during real-time RGA mass spectrometry characterization. In this case, due to the lower concentration of such gaseous species relative to the process gas, a peak associated with such gaseous species may be undetectable.

Thus, selected gas species associated with substrate arcing must be readily detected in the presence of processing gas. Selected gas species associated with substrate arcing can be identified by comparing: (i) baseline (or reference) spectrometry signals of the process gas in the absence of an arcing event; to (ii) spectrometry signals during a substrate arcing event. In comparing the two different spectrometry signals, selected gas species associated with substrate arcing can be readily identified.

In alterative embodiments, the gas sensors can include inductively coupled plasma optical emission (ICP-OE) spectrometers, infrared absorption spectrometers or a Fourier transform infrared (FTIR) spectrometers. However, the ICP-OE and FTIR techniques may be less than satisfactory for certain applications, because the ability to detect different gases is strongly dependent upon atomic and molecular structure.

EXAMPLE 1

To simulate an arcing event during plasma processing, silicon coupons (about 3 cm×3 cm) were coated with a 193 nm organic photoresist coating and subsequently thermally decomposed during plasma processing in Ar plasma. These tests demonstrated that thermal decomposition of by-products of organic photoresists in an inert gas plasma were detectable using the RGA mass spectrometry technique. Tests were performed in a 2300® EXELAN® FLEX-3X™ dielectric etching system, manufactured by Lam Research Corporation (Fremont, Calif.) and gas species were monitored by a RGA200 residual gas analyzer, manufactured by Stanford Research Systems (Sunnyvale, Calif.).

Figure 2A:
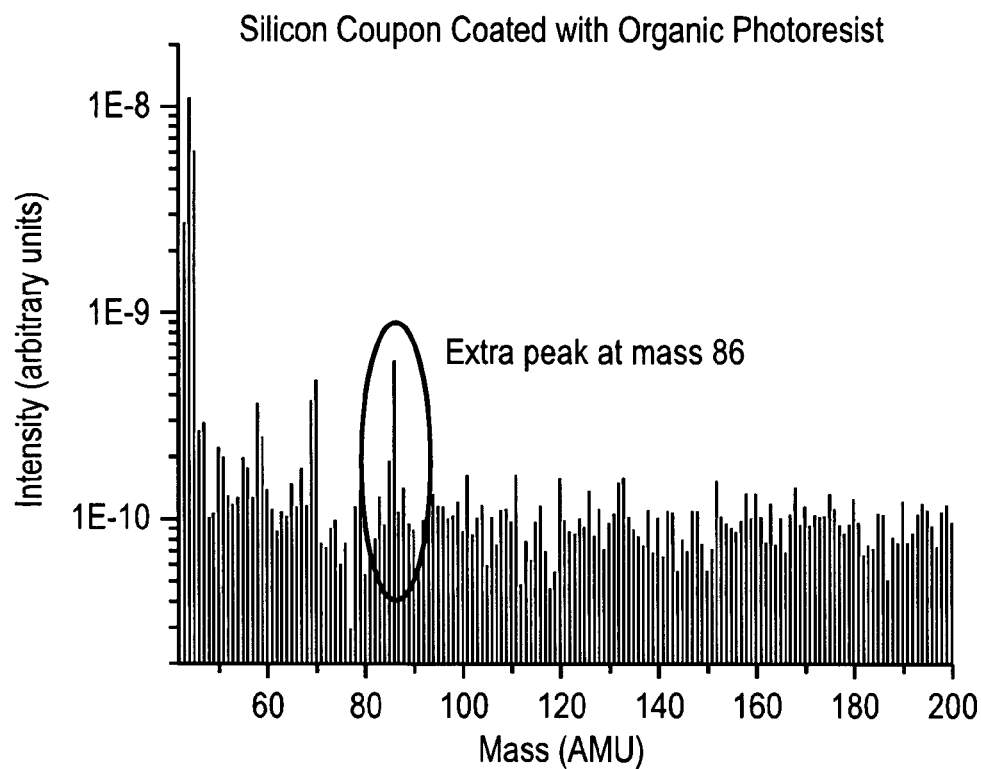
FIG. 2A is a real-time signal from an RGA mass spectrometer of intensity as a function of atomic mass for processing of a silicon coupon coated with organic photoresist in Ar plasma.

The thermal decomposition test was performed by coating a 193 nm organic photoresist on a silicon test coupon (about 3 cm×3 cm) and plasma processing the test coupon in Ar plasma. Each test coupon was placed over a bare silicon wafer. A gas mixture of 200 SCCM Ar was introduced into the etch chamber at a chamber pressure of 80 mTorr. Duel-frequency RF power was applied to the bottom electrode, about 1500 W at a frequency of about 2 MHz and about 800 W at a frequency of about 60 MHz. The temperature of the lower electrode was set at about 60° C.; the temperature of the upper electrode was set at about 120° C. During plasma processing, the temperature of the silicon wafer was about 20° C. to about 30° C. higher than the temperature of the lower electrode, which was set to about 60° C. The temperature of the test coupon mounted on the silicon wafer is potentially much higher, depending on the extent of thermal coupling between the coupon and the silicon wafer. In this case, with poor thermal contact, the test coupon is expected to achieve a temperature much higher than that of the silicon wafer. The total process time was about 120 seconds. During plasma processing, the composition of the gases flowing through the processing chamber were monitored by RGA mass spectrometry. The combination of the plasma exposure and heating resulted in the thermal decomposition of the organic photoresist. FIG. 2A is a real-time signal from an RGA mass spectrometer of intensity (in arbitrary units) as a function of atomic mass (in atomic mass units or AMU) for the decomposition of organic photoresist in an Ar plasma.

To identify the atomic mass peak associated with organic photoresist decomposition, the real-time signal from an RGA mass spectrometer for the silicon and silicon with a photoresist coating without decomposing was measured. The test conditions described above were repeated for: (i) a bare silicon wafer with no coupon in Ar plasma; and (ii) a photoresist-coated silicon coupon attached to a bare silicon wafer with thermal paste in Ar plasma.

Figure 2B:
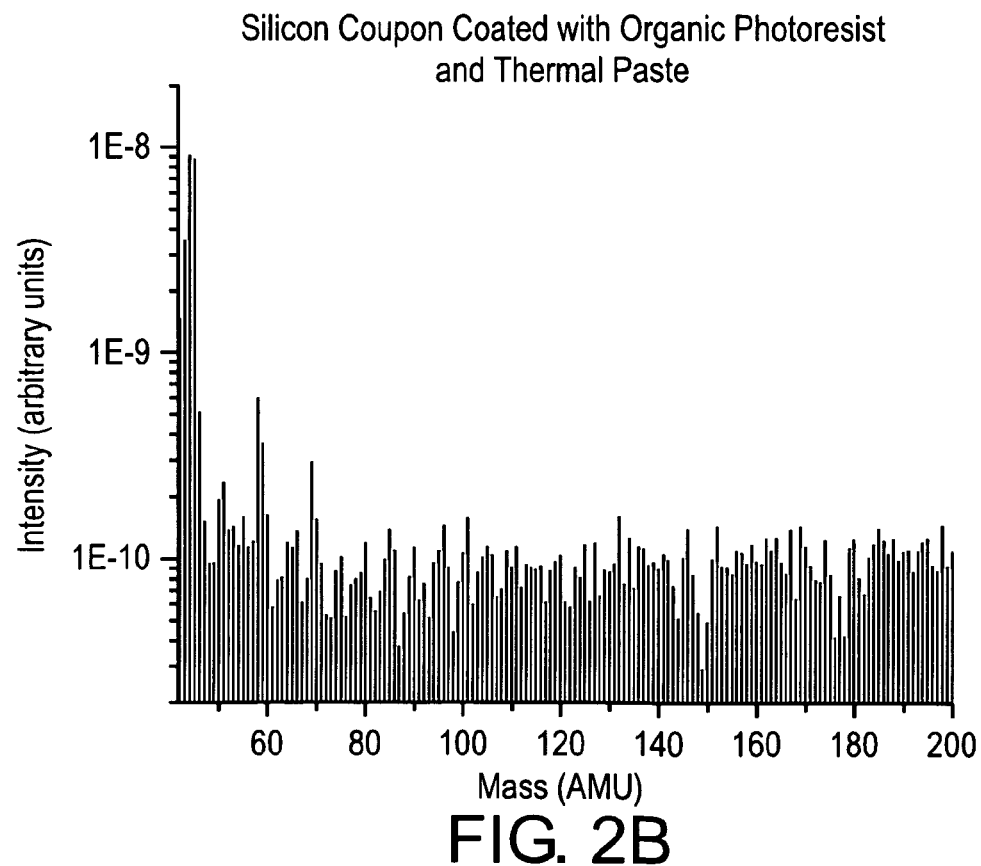
FIG. 2B is a real-time signal from an RGA mass spectrometer of intensity as a function of atomic mass for processing of a silicon coupon coated with organic photoresist with thermal paste applied to the backside of the coupon during processing in Ar plasma.
Figure 2C:
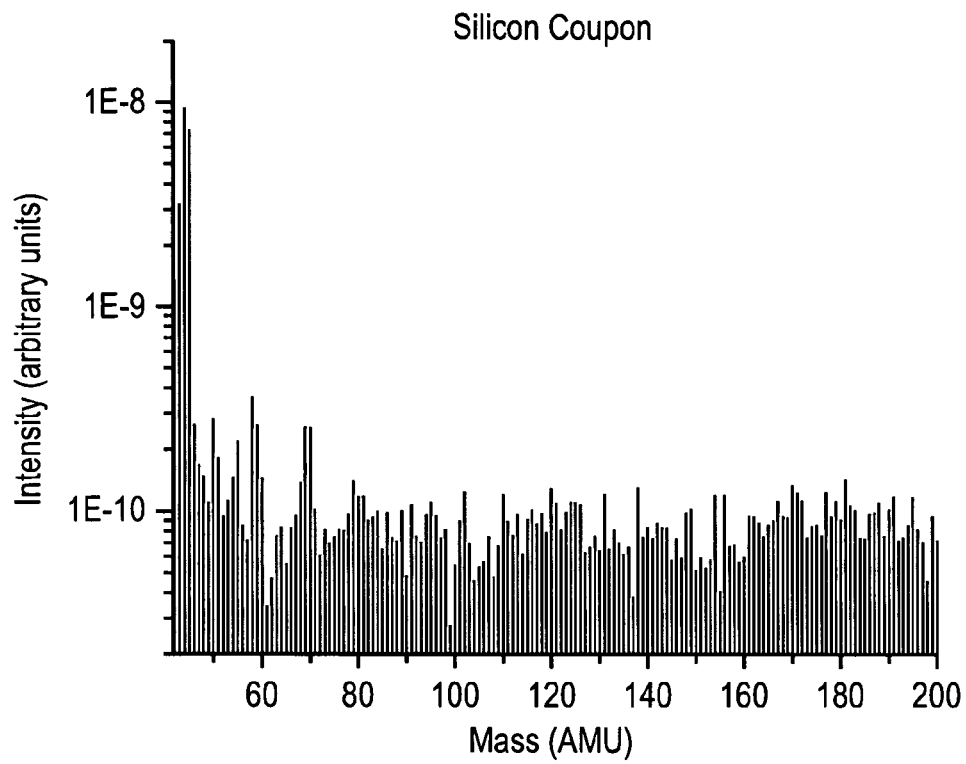
FIG. 2C is a real-time signal from an RGA mass spectrometer of intensity as a function of atomic mass for processing of a silicon coupon during processing in Ar plasma.

To prevent thermal decomposition, the thermal paste was applied to the backside of the test coupon to facilitate the removal of heat from the photoresist coating due to plasma processing. This results in a much lower temperature at the test coupon, as compared to the case with no thermal paste. The real-time signals from the RGA mass spectrometer for the bare silicon coupon and the photoresist coated silicon coupon with thermal paste are illustrated in FIGS. 2B and 2C, respectively. The real-time signals in FIGS. 2A-2C were measured during the first few seconds of plasma processing.

In comparing FIGS. 2A-2C, it has been determined that a peak at atomic mass 86 was associated with the thermal decomposition of organic photoresist, which also exhibited a gradual decay as a function of time with continued plasma processing. Thus, this testing has demonstrated that the thermal decomposition of photoresist results in an extra peak at mass 86.

Figure 3:
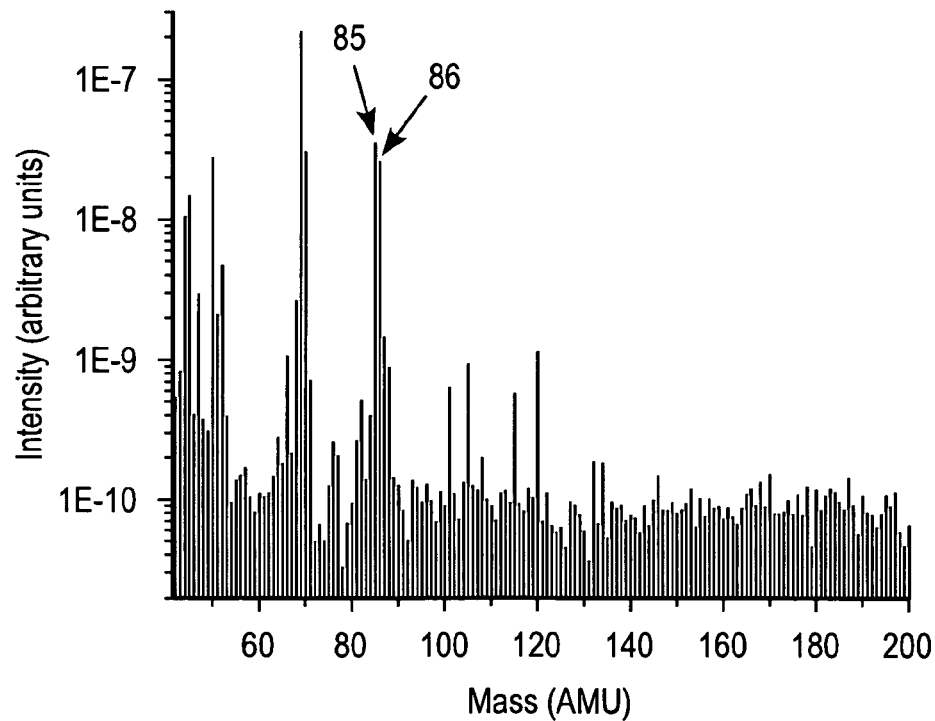
FIG. 3 is a real-time signal from an RGA mass spectrometer of intensity as a function of atomic mass for processing of a silicon coupon in $CF_4$ plasma.

However, although a peak at mass 86 was identified as a potential indicator for photoresist decomposition, the use of fluorine-based etching gases may potentially mask the peak at mass 86 associated with photoresist decomposition. The above described test was repeated using $CF_4$ gas instead of Ar for processing a bare silicon coupon. The real-time signal from the RGA mass spectrometer for bare silicon in $CF_4$ plasma is illustrated in FIG. 3. From the real-time signal in FIG. 3, it has been determined that $CF_4$ plasma is characterized by two intense peaks at mass 85 and at mass 86, in the absence of organic photoresist. Thus, the detection of a mass peak 86 to indicate organic photoresist decomposition could be less than completely satisfactory if the process gas is fluorocarbon based (e.g., $CF_4$).

EXAMPLE 2

In the next set of tests, organic photoresist decomposition products were detected by RGA mass spectrometry during an arcing event. As described above, the tests were performed in a 2300® EXELAN® FLEX-3X™ dielectric etching system coupled with a RGA200 residual gas analyzer for real-time analysis of gas concentration during plasma processing.

A silicon coupon was coated with 193 nm organic photoresist and subjected to plasma processing in Ar plasma. During plasma processing, the composition of the gases flowing through the processing chamber were monitored by RGA mass spectrometry. To induce arcing, the photoresist coated wafer was attached to a bare silicon coupon (about 3 cm×3 cm) that was partially grounded by bonding a metal wire to the coupon.

Argon flowing at 575 SCCM was introduced into the etch chamber at a chamber pressure of 80 mTorr. RF power was applied to the bottom electrode with a power of about 1000 W at a frequency of about 27 MHz. The temperature of the lower electrode was set at about 20° C.; the temperature of the upper electrode was set at about 80° C. During plasma processing, the composition of the gases flowing through the processing chamber were monitored by RGA mass spectrometry. The silicon wafer was exposed to plasma processing for about 60 seconds, in which an arcing event was detected after about 25 seconds of processing. After testing was completed, the arcing event was confirmed by a visual inspection of the silicon coupon and the showerhead electrode. Both the silicon coupon and showerhead electrode exhibited discoloration that was characteristic of damage caused by arcing.

Figure 4A:
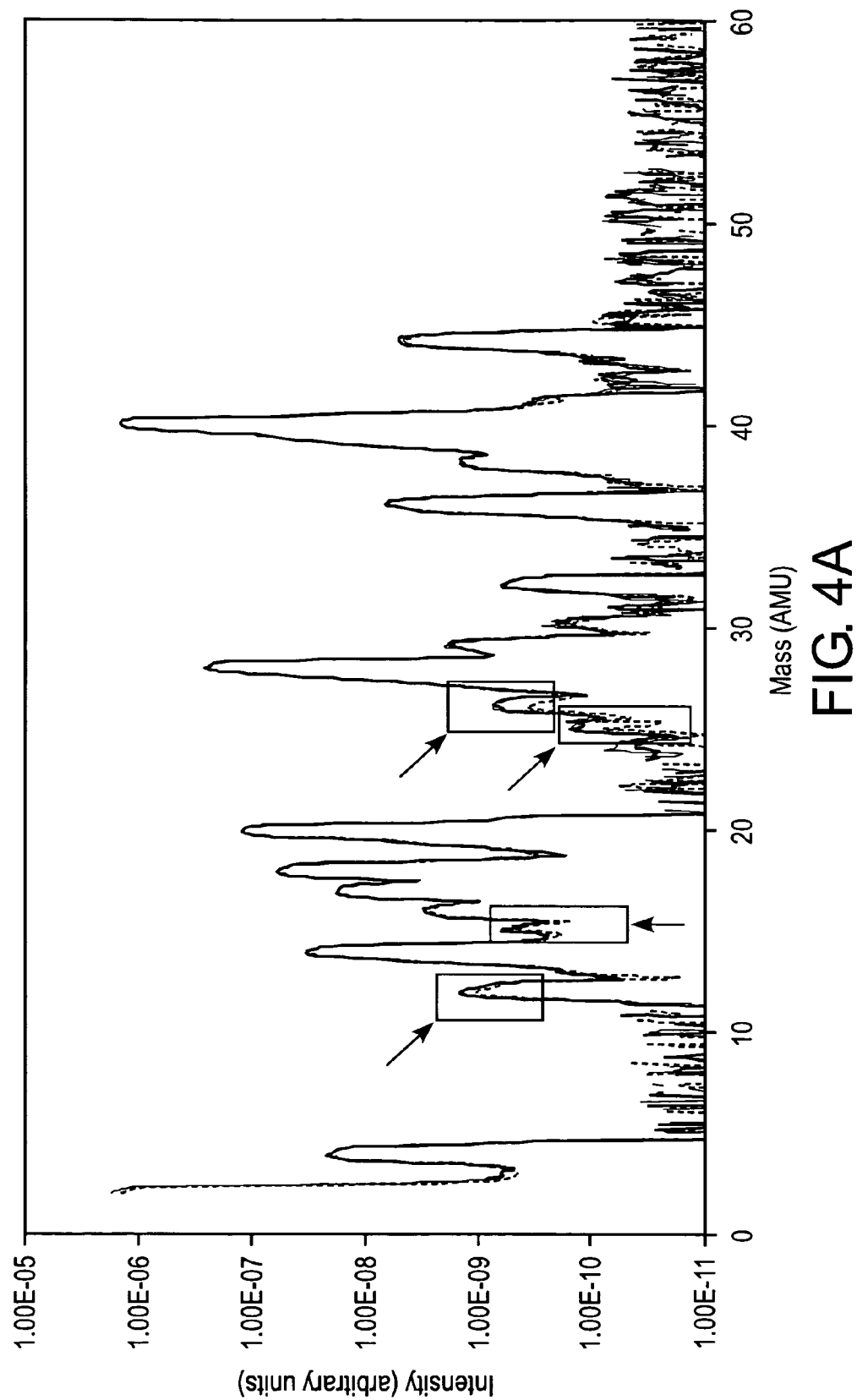
FIG. 4A is a real-time signal from an RGA mass spectrometer of intensity as a function of atomic mass during the occurrence of an arcing event for processing of a silicon coupon coated with organic photoresist in Ar plasma.
Figure 4B:
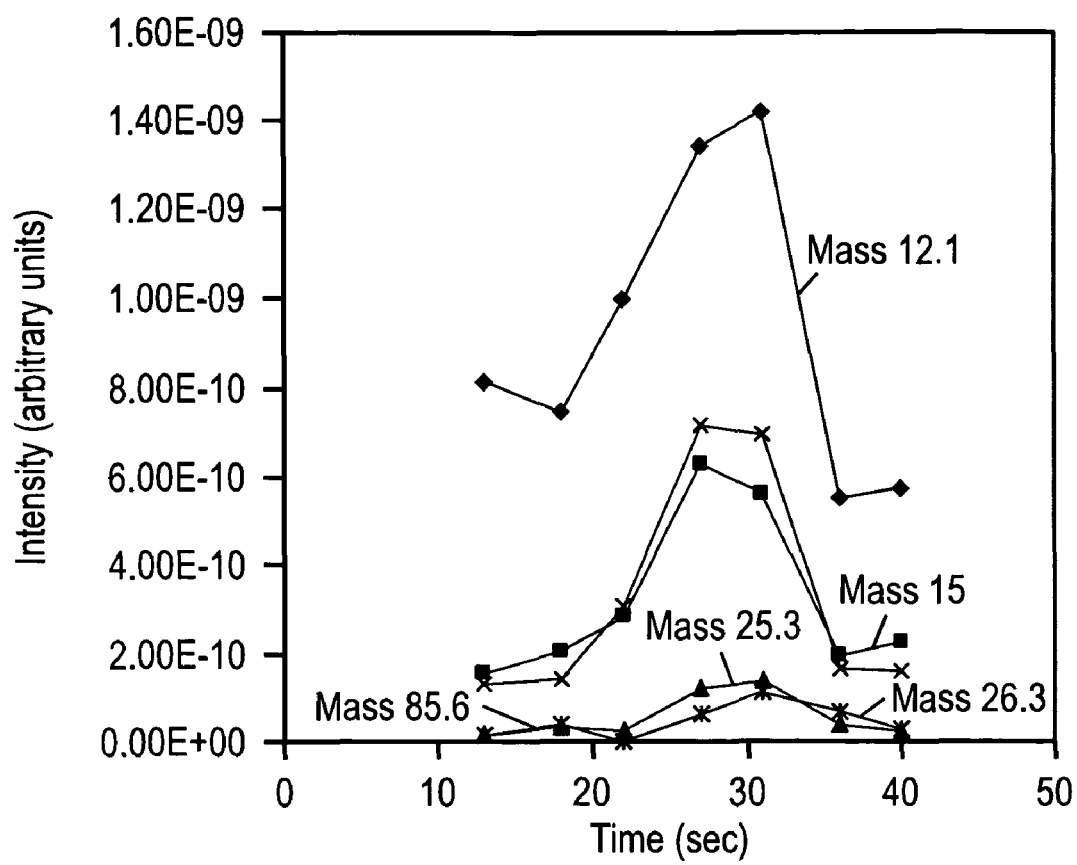
FIG. 4B is a real-time signal from an RGA mass spectrometer of intensity as a function of time during the occurrence of an arcing event for processing of a silicon coupon coated with organic photoresist in Ar plasma.

FIG. 4A is a real-time signal from the RGA mass spectrometer of intensity (in arbitrary units) as a function of atomic mass (in atomic mass units or AMU) for the decomposition of organic photoresist in Ar plasma. Regions of interest (i.e., mass 12.1, mass 15, mass 25.3, mass 26.3 and mass 85.6) in FIG. 4A, are indicated by the dark arrows. FIG. 4B is a real-time signal from the RGA mass spectrometer of intensity as a function of plasma processing time for mass 12.1, mass 15, mass 25.3, mass 26.3 and mass 85.6. As illustrated in FIG. 4B, five atomic masses experienced a sharp increase in intensity at about 20 seconds. From about 25 to 30 seconds, the five atomic masses reached a maximum intensity. At about 35 seconds, the intensities of the five atomic masses fell to their original levels. Thus, this testing has demonstrated that the thermal decomposition of photoresist associated with an arcing event results in extra peaks at mass 12.1, mass 15, mass 25.3, mass 26.3 and mass 85.6.

Figure 5:
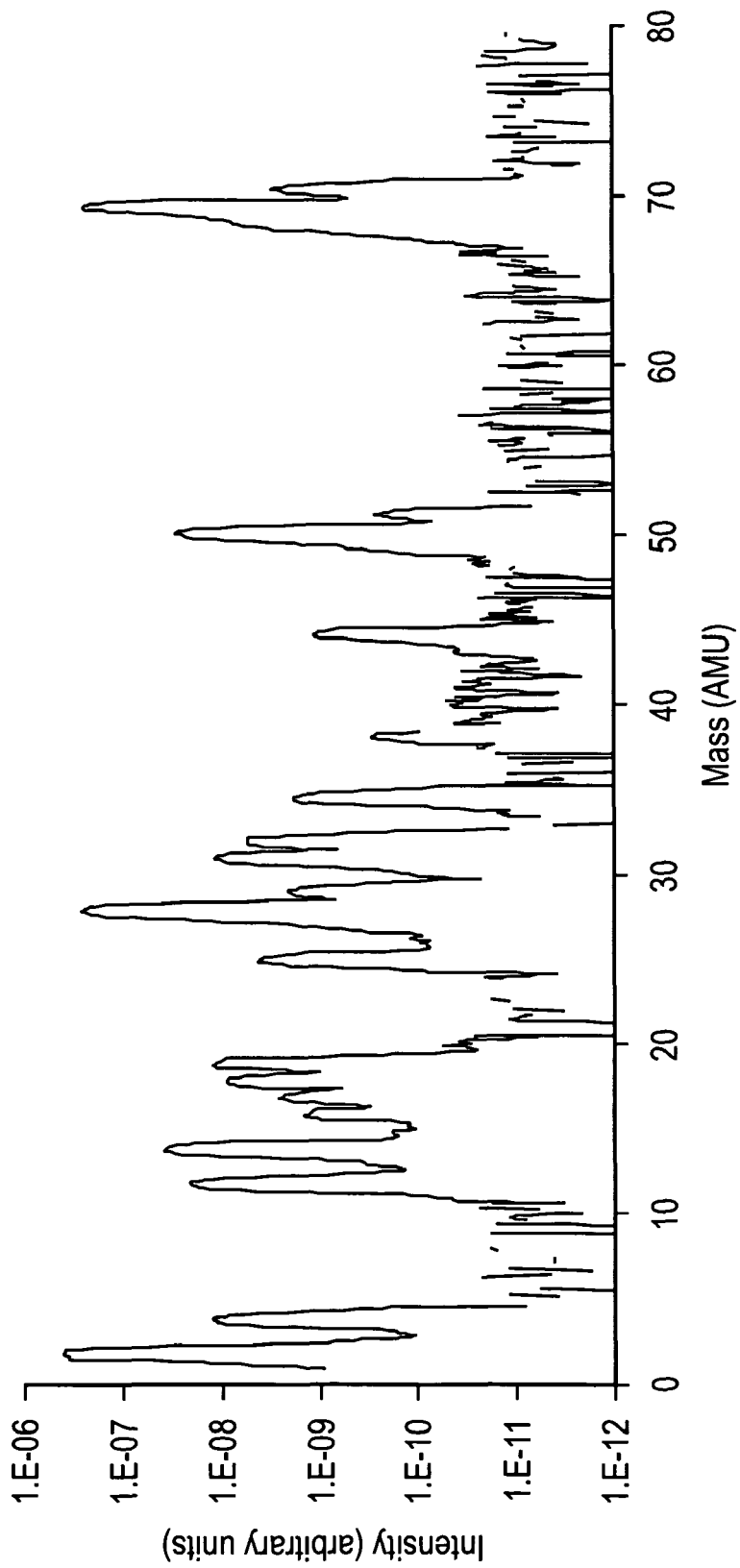
FIG. 5 is a real-time signal from an RGA mass spectrometer of intensity as a function of atomic mass for a $CF_4/N_2$ gas mixture, in which no plasma is generated.

As described above, the use of fluorine-based etching gases may potentially mask the mass peaks which indicate the occurrence of photoresist decomposition associated with an arcing event. Real-time analysis of gas concentration of a $CF_4/N_2$ etching gas mixture was performed by flowing 150 SCCM $CF_4$/50 $N_2$ into the etching chamber at a pressure of 80 mTorr. No plasma was generated. The real-time signal from the RGA mass spectrometer for the $CF_4/N_2$ gas mixture is illustrated in FIG. 5. From FIG. 5, the $CF_4/N_2$ real-time signal from the mass spectrometer is characterized by intense peaks at mass 12.1 and 25.3, potentially masking any increase in intensity due to arcing. In comparing the real-time signals of FIG. 4A and FIG. 5, it has been determined that arcing events resulting in extra peaks at mass 15 and mass 26.3 are readily detectable in a $CF_4$ etching gas.

The preferred embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of detecting substrate arcing in a semiconductor plasma processing apparatus, comprising:
   placing a substrate on a substrate support in a reaction chamber of a plasma processing apparatus;
   introducing process gas into the reaction chamber;
   generating a plasma from the process gas;
   processing the substrate with the plasma;
   monitoring intensities of real-time mass-spectrometry signals of selected gas species produced in the reaction chamber during plasma processing, wherein the selected gas species are generated by a substrate arcing event; and
   detecting the arcing event when the intensities are above a threshold value.

2. The method of claim 1, wherein the substrate contains aluminum, copper, silicon, organic dielectric or organic photoresist; and the selected gas species generated by the substrate arcing event include aluminum-, copper- or silicon-bearing species and/or decomposition products of the organic material.

3. The method of claim 1, further comprising identifying selected gas species generated by the substrate arcing event, comprising:
monitoring intensities of real-time mass-spectrometry signals of the process gases in the absence of the substrate arcing event;
monitoring intensities of real-time mass-spectrometry signals during the substrate arcing event; and
comparing the intensities of real-time mass-spectrometry signals of the process gases in the absence of the substrate arcing event to the intensities of real-time mass-spectrometry signals during the substrate arcing event.

4. The method of claim 1, wherein monitoring intensities of real-time mass-spectrometry signals is performed by a residual gas analyzer (RGA) mass spectrometer.

5. The method of claim 3, wherein the selected gas species include decomposition products which produce signals at 12, 15, 25, 26, 85 or 86 atomic mass units (AMU) in a residual gas analyzer (RGA).

6. The method of claim 1, further comprising generating a warning signal when an arcing event is detected to terminate the plasma process.

7. The method of claim 1, wherein introducing process gases into the reaction chamber is performed by injecting processing gases through a showerhead; and monitoring intensities of real-time mass-spectrometry signals of selected gas species includes collecting gas species from a channel in the showerhead or a sampling tube adjacent to the substrate.

8. The method of claim 1, wherein processing the substrate with the plasma includes: (a) plasma etching of semiconductors, metals or dielectrics; or (b) deposition of conductive or dielectric material.

9. The method of claim 8, wherein the process gases for plasma etching include hydrocarbon gases, fluorocarbon gases, hydrofluorocarbon gases, halogen-containing gases, oxygen-containing gases, nitrogen-containing gases and inert gases; and mixtures thereof.

10. The method of claim 8, wherein process gases for deposition include silicon-containing reactant gas selected from the group consisting of $SiH_4$, $SiF_4$, $Si_2H_6$, tetraethylorthosilicate (TEOS), tetramethylcyclotetrasiloxane (TMCTS), alone or in combination with additional process gases including $H_2$, $O_2$, $N_2$, $NH_3$, $NF_3$, $N_2O$ and NO; and mixtures thereof.

11. The method of claim 1, wherein the process gas is a fluorine containing etch gas and the signals monitored are at 12.1, 15, 25.3, 26.3 and 85.6 atomic mass units (AMU) in a residual gas analyzer (RGA).

12. The method of claim 1, wherein the selected gas species generated by the substrate arcing event are decomposition products of at least one of the process gas or a photoresist.

13. The method of claim 3, wherein the selected gas species include decomposition products which produce signals that are not masked by the substrate arcing event or by the plasma at 12.1, 15, 25.3, 26.3, 85, 85.6 or 86 atomic mass units (AMU) in a residual gas analyzer (RGA).

* * * * *

UNITED STATES PATENT AND TRADEMARK OFFICE
Certificate

Patent No. 8,158,017 B2                                                                           Patented: April 17, 2012

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Eric Hudson, Berkeley, CA (US); and Andreas Fischer, Castro Valley, Alameda, CA (DE).

Signed and Sealed this Tenth Day of July 2012.

*NADINE NORTON*
*Supervisory Patent Examiner*
*Art Unit 1713*
*Technology Center 1700*